(12) United States Patent
Zhao et al.

(10) Patent No.: US 8,811,000 B2
(45) Date of Patent: Aug. 19, 2014

(54) ELECTRONIC DEVICE

(75) Inventors: Bao-Gang Zhao, Shenzhen (CN); Ping Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 98 days.

(21) Appl. No.: 13/535,504

(22) Filed: Jun. 28, 2012

(65) Prior Publication Data

US 2013/0100594 A1   Apr. 25, 2013

(30) Foreign Application Priority Data

Oct. 21, 2011   (CN) ...................... 2011 2 0404222 U

(51) Int. Cl.
   *H05K 5/02*   (2006.01)

(52) U.S. Cl.
   USPC ...................... 361/679.01; 361/600; 361/747

(58) Field of Classification Search
   USPC ............. 361/679.01, 679.02, 679.04, 679.43, 361/679.51, 679.55, 679.56, 679.57, 361/679.58, 723, 724, 725, 726, 730, 732, 361/733, 740, 741, 742, 747, 752, 756, 758, 361/759, 829; 174/50, 520, 559, 562; 312/223.2, 265.6, 222, 205, 223.1; 292/137, 161, 159, 150, 152
   See application file for complete search history.

(56) References Cited

U.S. PATENT DOCUMENTS

| | | | | |
|---|---|---|---|---|
| 6,373,690 | B1* | 4/2002 | Buican et al. | 361/679.59 |
| 7,269,020 | B2* | 9/2007 | Wang et al. | 361/727 |
| 7,278,147 | B2* | 10/2007 | Pen | 720/646 |
| 7,447,012 | B2* | 11/2008 | Yu | 361/679.33 |
| 7,448,702 | B2* | 11/2008 | Chen et al. | 312/223.2 |
| 7,996,858 | B2* | 8/2011 | Ohira | 720/646 |
| 8,297,719 | B2* | 10/2012 | Tu et al. | 312/223.2 |
| 2005/0269828 | A1* | 12/2005 | Miyamoto | 296/39.2 |
| 2006/0020956 | A1* | 1/2006 | Lee | 720/652 |
| 2006/0150208 | A1* | 7/2006 | Lo | 720/613 |
| 2007/0016917 | A1* | 1/2007 | Lo | 720/646 |
| 2007/0152547 | A1* | 7/2007 | Chen et al. | 312/223.2 |
| 2012/0250266 | A1* | 10/2012 | Zhao et al. | 361/748 |

* cited by examiner

*Primary Examiner* — Robert J Hoffberg
*Assistant Examiner* — Michael Matey
(74) *Attorney, Agent, or Firm* — Novak Druce Connolly Bove + Quigg LLP

(57) ABSTRACT

An electronic device includes a bottom cover and a front panel. The bottom cover includes at least one first wall. The at least one first wall includes a locking portion set on an inner surface of the at least one first wall. The front panel defines at least one hole. The at least one hole is locked to the locking portion to secure the front panel to the bottom cover.

15 Claims, 7 Drawing Sheets

ELECTRONIC DEVICE

BACKGROUND

1. Technical Field

The present disclosure relates to electronic devices.

2. Description of Related Art

Electronic devices, such as DVD players, include a bottom cover, an upper cover covering on the bottom cover to form a casing with an opening, and a front panel arranged on the opening to form a close space with the bottom cover and the upper cover. The bottom cover includes a bottom plate and two sidewalls vertically extended from the two opposite edges of the bottom plate. Each sidewall includes a bulge on the outer surface of the sidewall. The front panel includes two opposite blocking plates. Each blocking plate defines a hole for receiving the bulge, such that the front panel is fixed on the outer surface of the bottom cover. However, the front panel is easily deformed to cause the bulge to disengage from the hole during use which results in the front panel separating from the bottom cover.

Therefore, there is room for improvement in the art.

BRIEF DESCRIPTION OF THE FIGURE

The components of the drawings are not necessarily drawn to scale, the emphasis instead being placed upon clearly illustrating the principles of the embodiment of an electronic device. Moreover, in the drawings, like reference numerals designate corresponding parts throughout several views.

DETAILED DESCRIPTION

Embodiments of the present disclosure will now be described in detail with reference to the drawings.

Figure 1:
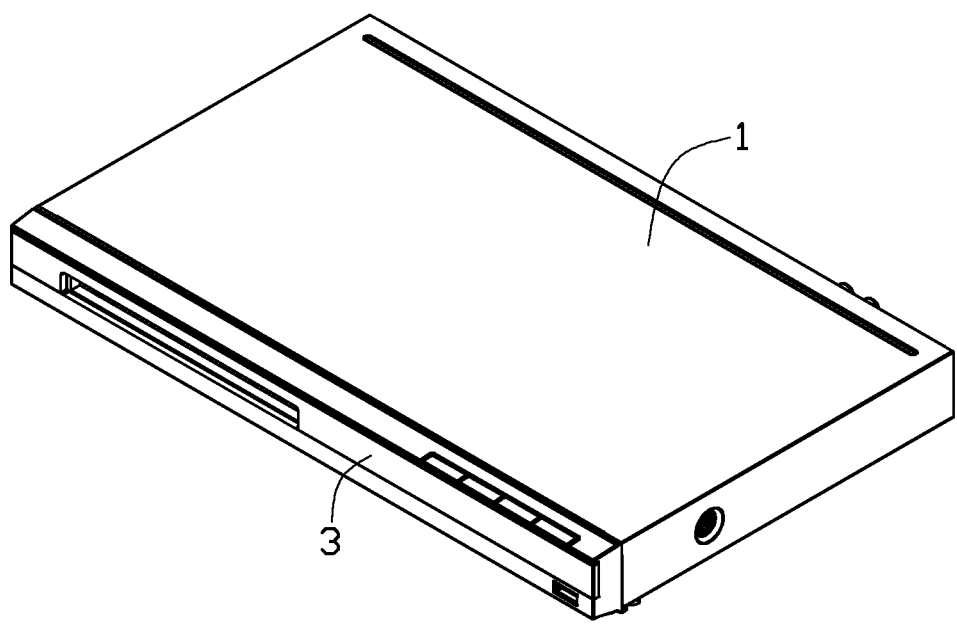
FIG. 1 is a schematic view of an electronic device, according to an embodiment.
Figure 2:
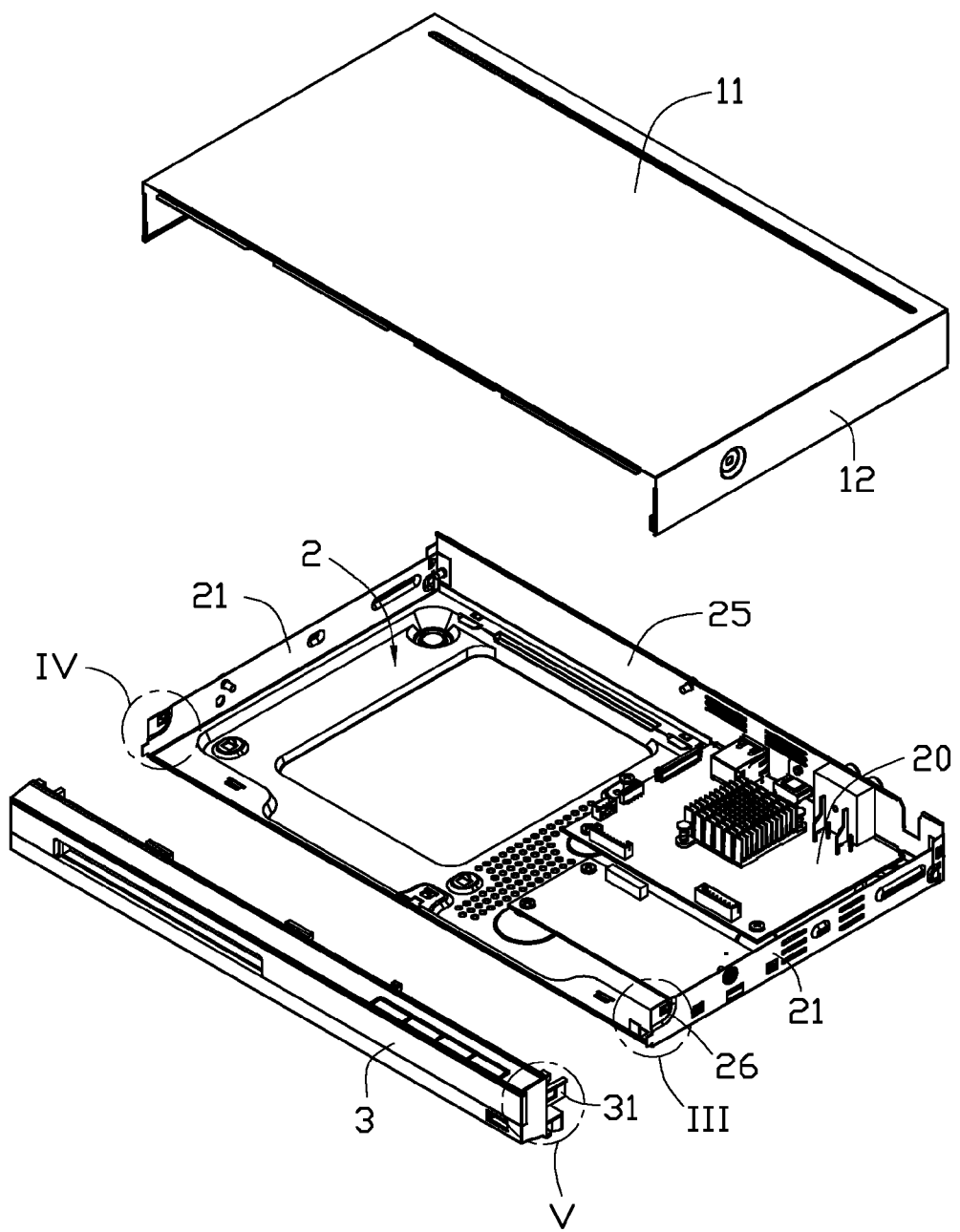
FIG. 2 is a partially disassembled view of the electronic device of FIG. 1.

FIGS. 1 and 2, shows an electronic device 100 including an upper cover 1, a bottom cover 2 fixed on the upper cover 1, and a front panel 3. The front panel 3 cooperates with the upper cover 1 and the bottom cover 2 to form a closed space (not labeled). In the embodiment, the electronic device is a portable DVD player.

The upper cover 1 includes a top plate 11 and two sidewalls 12. The top plate 11 is a substantially rectangular. The sidewalls 12 vertically extend from the opposite edges of the top plate 11.

The bottom cover 2 includes a bottom plate 20, two opposite first walls 21, and a second wall 25. The bottom plate 20 is a substantially rectangular and corresponds to the top plate 11. The first walls 21 and the second wall 25 are vertically extended from the three adjacent edges of the bottom plate 20. The first walls 21 are parallel with each other and correspond to the sidewalls 12 respectively. The second wall 25 is parallel with the front panel 3 and connected ends of the first walls 21 away from the front panel 3. In the embodiment, there are a plurality of holes (not labeled) set on the first wall 21 and the second wall 25.

Figure 3:
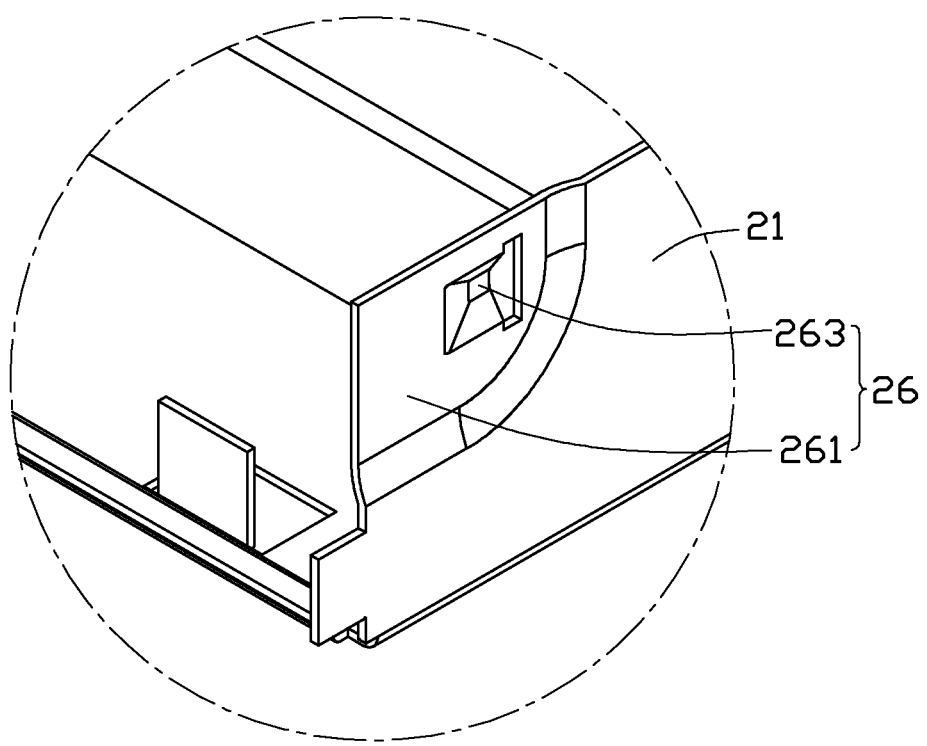
FIG. 3 is an enlarged view of the section III of the electronic device of FIG. 2.
Figure 4:
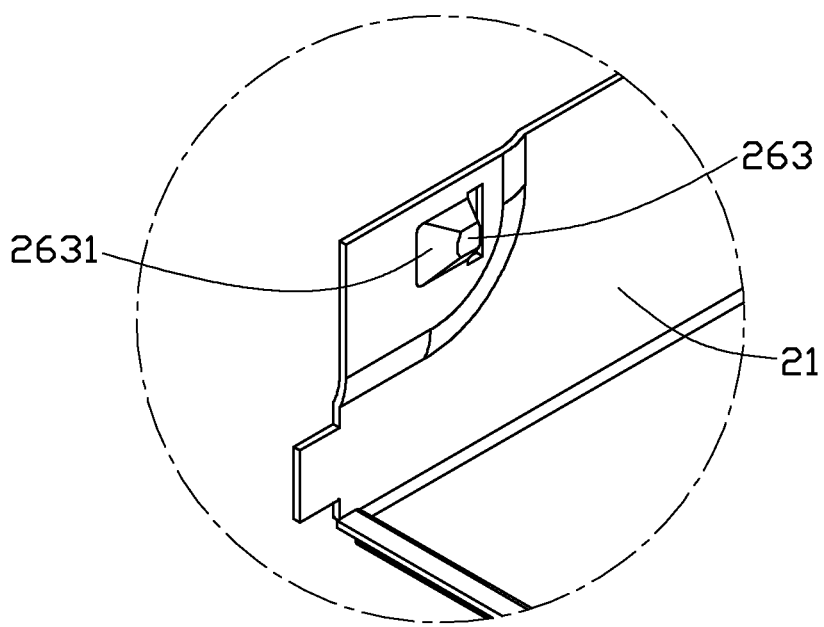
FIG. 4 is an enlarged view of section IV of the electronic device of FIG. 2.

Referring to FIGS. 3 and 4, an end of each first wall 21 away from the second wall 25 forms a locking portion 26. The locking portion 26 includes a recess portion 261 and a bulge 263.

The recess portion 261 is concaved from the outer surface to the inner surface of the first wall 21. The recess portion 261 is arranged at end of the first wall 21 away from the second wall 25 and the bottom plate 20. The recess portion 261 is substantially a sector which is bounded by an arc line on the outer surface and two adjacent edges of the first wall 21. In the embodiment, the recess portion 261 is formed by a stamping process.

The bulge 263 is perpendicularly protruded from the bottom of the recess portion 261. The bulge 263 includes four inclined surfaces 2631 for guiding the front panel 3. The bulge 263 defines a gap 2632 (see FIG. 7) set on the inclined surface 2631 of the bulge 263 facing to the second wall 25. In the embodiment, when viewed from the inner surface of the first wall 21, the recess portion 261 protrudes out of the inner surface of the first wall 21, and the bulge 263 further protrudes out of an inner surface of the recess portion 261; when viewed from the outer surface of the first wall 21, the recess portion 261 is recessed in the outer surface of the first wall 21, and the bulge 263 is further recessed in the bottom (an outer surface) of the recess portion 261.

Figure 5:
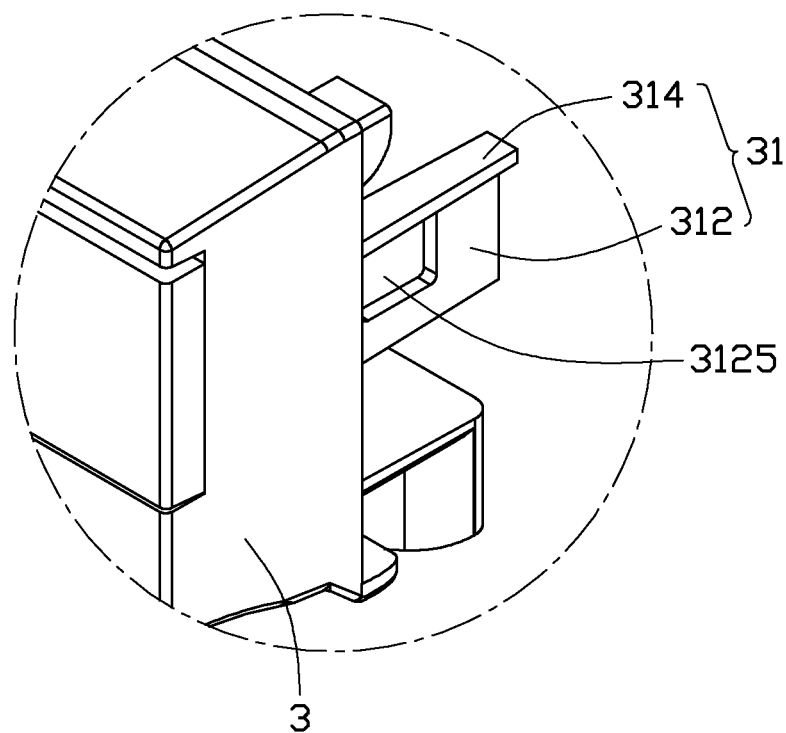
FIG. 5 is an enlarged view of section V of the electronic device of FIG. 2.

Referring to FIG. 5, the front panel 3 is a substantially rectangular. The front panel 3 includes two fixing portions 31. The fixing portions 31 are arranged at opposite ends of the front panel 3 and correspond to the locking portions 26 respectively. The fixing portions 31 are made of elastic material. The cross-section of the fixing portions 31 is substantially L-shaped. The cross-section of the fixing portion 31 is parallel with the front panel 3. Each of the fixing portions 31 includes a first rectangular plate 312 and a second rectangular plate 314. The first plate 312 is parallel with the first wall 21. The first plate 312 defines a rectangular hole 3125. The holes 3125 correspond to and receive the bulge 263 respectively. The size of the holes 3125 is slightly greater than the size of the bulge 263. The second plate 314 perpendicular bents from one edge of the first plate 312 and connects with the inner surface of the front panel 3. The second plate 314 functions as a rib for enhancing the stiffness of the first plate 312.

Figure 6:
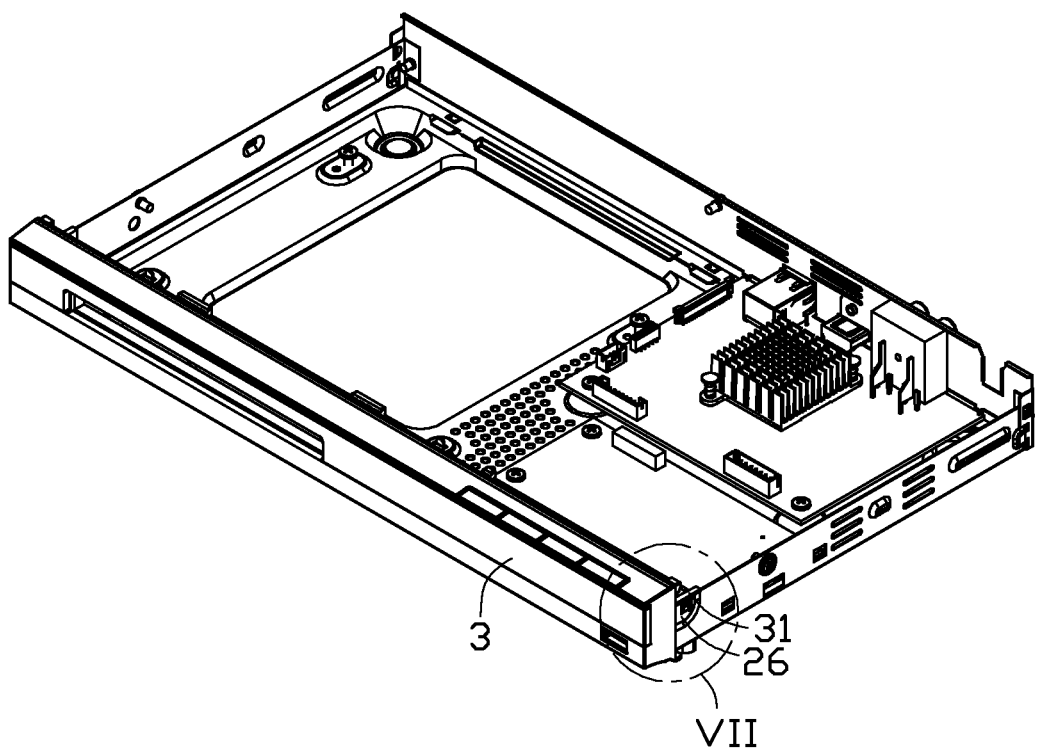
FIG. 6 is a partially assembled view of the electronic device without the upper cover of FIG. 2.
Figure 7:
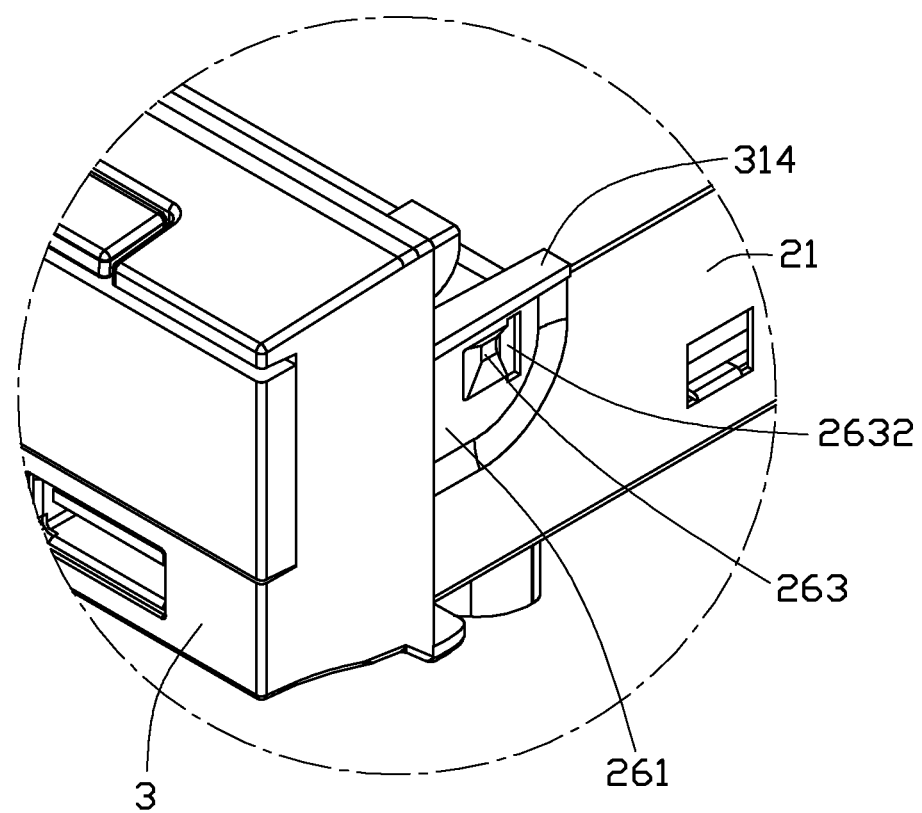
FIG. 7 is a partially enlarged view of section VII of the electronic device of FIG. 6.

Referring to FIGS. 6 and 7, in assembly, the first plate 312 is elastically deformed to allow the two holes 3125 to receive and lock to the bulges 263 respectively via the inclined surface 2631. The second plate 314 is disposed on the first wall 21 and abuts the upper of the recess portion 261. Thus the front panel 3 is secured to the inner side of the bottom cover 2. After assembly, because the bulge 263 protrudes out of the inner surface of the first wall 21 and is locked to the holes 3125, the front panel 3 is steadily secured to the bottom cover 2 and is prevented from disengaging with the bottom cover 2.

When disassembling the front panel 3 from the bottom cover 2, the second plate 314 is pushed to disengage the bulge 263 from the hole 3125, and the front panel 3 is easily separated from the bottom cover 2.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A housing of an electronic device, comprising:
a bottom cover comprising at least one first wall;
a front panel secured to the bottom cover and defining at least one hole; and
a locking portion concaved from each of the at least one first wall, each locking portion comprises a bulge, the bulge protrudes from an inner surface of a corresponding one of the at least one first wall along a direction towards an inside of the housing, the bulge comprises four inclined surfaces, the inclined surfaces are configured for guiding and securing the front panel to the bottom cover for preventing the front panel from moving along a direction away from the housing;
wherein the bulge locks with a corresponding one of the at least one hole so that a portion of the front panel is within the inside of the housing.

2. The housing of claim 1, wherein the bottom cover further comprises a second wall; the second wall is parallel with the front panel and connected to an end of the corresponding one of the at least one first wall away from the front panel; the bulge further comprises a gap; the gap is set on one of the inclined surfaces facing the second wall.

3. The housing of claim 1, wherein each locking portion further comprises a recess portion; the recess portion is arranged at an end of the corresponding one of the at least one first wall which is adjacent to the front panel; the recess portion is concaved from an outer surface to the inner surface of the corresponding one of the at least one first wall, and the bulge is produced from the bottom of the recess portion.

4. The housing of claim 3, wherein the recess portion is substantially a sector which is bounded by an arced line on the outer surface and two adjacent edges of the corresponding one of the at least one first wall.

5. The housing of claim 1, wherein the portion of the front panel comprises at least one fixing portion; each of the at least one fixing portion is arranged at an end of the front panel and corresponds to the respective one of the locking portion.

6. The housing of claim 5, wherein a cross-section of each of the at least one fixing portion is substantially L shaped, each of the at least one fixing portion comprises a first plate and a second plate; the first plate is parallel with each of the at least one first wall; the second plate perpendicular bents from one edge of a respective one of the first plate and connects with an inner surface of the front panel; the corresponding one of the at least one hole is defined in the first plate.

7. The housing of claim 6, wherein the first plate and the second plate are substantially rectangular shaped and made of elastic material.

8. An electronic device, comprising:
a housing with a bottom cover comprising at least one first wall;
a front panel detachably secured to the bottom cover and defining at least one hole; and
a locking portion concaved from each of the at least one first wall, each locking portion comprises a bulge, the bulge protrudes from an inner surface of a corresponding one of the at least one first wall along a direction towards an inside of the housing, the bulge comprises four inclined surfaces, the inclined surfaces are configured for guiding and securing the front panel to the bottom cover for preventing the front panel from moving along a direction away from the housing;
wherein the bulge locks with a corresponding one of the at least one hole so that a portion of the front panel is within the inside of the housing.

9. The electronic device of claim 8, wherein the bottom cover further comprises a second wall; the second wall is parallel with the front panel and connected to an end of the corresponding one of the at least one first wall away from the front panel; the bulge further comprises a gap; the gap is set on one of the inclined surfaces facing the second wall.

10. The electronic device of claim 8, wherein each locking portion further comprises a recess portion; the recess portion is arranged at an end of the corresponding one of the at least one first wall which is adjacent to the front panel; the recess portion is concaved from an outer surface to the inner surface of the corresponding one of the at least one first wall, and the bulge is produced from the bottom of the recess portion.

11. The electronic device of claim 10, wherein the recess portion is substantially a sector which is bounded by an arced line on the outer surface and two adjacent edges of the corresponding one of the at least one first wall.

12. The electronic device of claim 8, wherein the portion of the front panel comprises at least one fixing portion; each of the at least one fixing portion is arranged at an end of the front panel and corresponds to the respective one of the locking portion.

13. The electronic device of claim 12, wherein a cross-section of each of the at least one fixing portion is substantially L shaped, each of the at least one fixing portion comprises a first plate and a second plate; the first plate is parallel with each of the at least one first wall; the second plate perpendicular bents from one edge of a respective one of the first plate and connects with an inner surface of the front panel; the corresponding one of the at least one hole is defined in the first plate.

14. The electronic device of claim 13, wherein the first plate and the second plate are substantially rectangular shaped and made of elastic material.

15. A housing of an electronic device, comprising:
a bottom cover comprising two walls;
a front panel detachably secured to the bottom cover and defining two holes; and
two locking portions, each locking portion concaved from a corresponding one of the two walls, each locking portion comprises a bulge, the bulge protrudes from an inner surface of the corresponding one of the two walls along a direction towards an inside of the housing, the bulge comprises four inclined surfaces, the inclined surfaces are configured for guiding and securing the front panel to the bottom cover for preventing the front panel from moving along a direction away from the housing;
wherein the bulge locks with a corresponding one of the two holes so that a portion of the front panel is within the inside of the housing.

* * * * *